US010444280B2

(12) United States Patent
Jayaraman et al.

(10) Patent No.: US 10,444,280 B2
(45) Date of Patent: Oct. 15, 2019

(54) INDEPENDENT TEST PARTITION CLOCK COORDINATION ACROSS MULTIPLE TEST PARTITIONS

(71) Applicant: NVIDIA CORPORATION, Santa Clara, CA (US)

(72) Inventors: Dheepakkumaran Jayaraman, Sunnyvale, CA (US); Karthikeyan Natarajan, Fremont, CA (US); Shantanu Sarangi, Saratoga, CA (US); Amit Sanghani, San Jose, CA (US); Milind Sonawane, San Jose, CA (US); Sailendra Chadalavda, Milpitas, CA (US); Jonathon E. Colburn, Ben Lomond, CA (US); Kevin Wilder, Menlo Park, CA (US); Mahmut Yilmaz, Los Altos Hills, CA (US); Pavan Kumar Datla Jagannadha, Santa Clara, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 15/336,676

(22) Filed: Oct. 27, 2016

(65) Prior Publication Data

US 2017/0115352 A1 Apr. 27, 2017

Related U.S. Application Data

(60) Provisional application No. 62/247,195, filed on Oct. 27, 2015, provisional application No. 62/285,429, filed on Oct. 27, 2015.

(51) Int. Cl.
*G01R 31/3185* (2006.01)
*G01R 31/3177* (2006.01)
(Continued)

(52) U.S. Cl.
CPC ..... *G01R 31/3177* (2013.01); *G01R 31/2607* (2013.01); *G01R 31/2803* (2013.01);
(Continued)

(58) Field of Classification Search
CPC .... G01R 31/318555; G01R 31/318572; G01R 31/318541; G01R 31/318536;
(Continued)

(56) References Cited

U.S. PATENT DOCUMENTS 5,535,331 A 7/1996 Swoboda et al.
5,656,963 A 8/1997 Masleid et al.
(Continued)

*Primary Examiner* — Samir W Rizk
*Assistant Examiner* — Enam Ahmed

(57) ABSTRACT

Granular dynamic test systems and methods facilitate efficient and effective timing of test operations. In one embodiment, a chip test system comprises: a first test partition operable to perform test operations based upon a first local test clock signal; a second test partition operable to perform test operations based upon a second local test clock signal; and a centralized controller configured to coordinate testing between the plurality of test partitions, wherein the coordination includes managing communication of test information between the plurality of test partitions and external pins. In one exemplary implementation, a trigger edge of the first local test clock signal is staggered with respect to a trigger edge of the second local test clock signal, wherein the stagger is coordinated to mitigate power consumption by test operations in the first test partition and test operations in the second test partition.

20 Claims, 12 Drawing Sheets

(51) Int. Cl.
*G01R 31/26* (2014.01)
*G06F 11/00* (2006.01)
*G01R 31/317* (2006.01)
*G01R 31/28* (2006.01)

(52) U.S. Cl.
CPC ..... *G01R 31/2806* (2013.01); *G01R 31/2834* (2013.01); *G01R 31/31701* (2013.01); *G01R 31/31707* (2013.01); *G01R 31/31724* (2013.01); *G01R 31/31725* (2013.01); *G01R 31/318555* (2013.01); *G06F 11/00* (2013.01)

(58) Field of Classification Search
CPC ............ G01R 31/3177; G01R 31/2607; G01R 31/2806; G01R 31/31725; G01R 31/2803; G01R 31/31724; G01R 31/31701; G01R 31/2834; H05K 999/99; G06F 11/00; G06F 11/1076; G06F 3/0659; G06F 3/0635; G06F 3/061; G06F 12/0646; G06F 3/0622; G06F 9/856; G06F 11/2094; G06F 63/068; G06F 11/1096; G06F 11/1092; G06F 3/067; G06F 3/0619; G06F 3/0623; G06F 3/064; G06F 2201/82; G06F 2201/805; G06F 2212/657; G06F 2212/1008; H04L 67/1097; H04L 63/101; H04L 63/06; H04L 63/08; H04L 9/14; H04L 47/803; H04L 41/0816; H04L 9/0861; H04L 63/0457; H04L 63/0428; H03M 13/3761; H03M 13/1515
USPC ...................................................... 714/727
See application file for complete search history.

(56) References Cited

U.S. PATENT DOCUMENTS

| | | | |
|---|---|---|---|
| 5,805,608 A | 9/1998 | Baeg et al. | |
| 5,812,562 A | 9/1998 | Baeg | |
| 5,970,241 A | 10/1999 | Deao et al. | |
| 6,016,555 A | 1/2000 | Deao et al. | |
| 6,055,649 A | 4/2000 | Deao et al. | |
| 6,065,106 A | 5/2000 | Deao et al. | |
| 6,081,885 A | 6/2000 | Deao et al. | |
| 6,106,568 A | 8/2000 | Beausang et al. | |
| 6,112,298 A | 8/2000 | Deao et al. | |
| 6,163,583 A | 12/2000 | Lin et al. | |
| 6,192,092 B1 | 2/2001 | Dizon et al. | |
| 6,343,365 B1 | 1/2002 | Matsuzawa et al. | |
| 6,473,439 B1 | 10/2002 | Zerbe et al. | |
| 6,493,802 B1 | 12/2002 | Razdan et al. | |
| 6,586,921 B1 | 7/2003 | Sunter | |
| 6,622,255 B1 | 9/2003 | Kurd et al. | |
| 6,724,328 B1 | 4/2004 | Lui et al. | |
| 6,763,485 B2 | 7/2004 | Whetsel | |
| 6,785,856 B1 | 8/2004 | Parker et al. | |
| 6,813,739 B1 | 11/2004 | Grannis, III | |
| 6,949,958 B2 | 9/2005 | Zerbe et al. | |
| 7,015,741 B2 | 3/2006 | Tschanz et al. | |
| 7,046,174 B1 | 5/2006 | Lui et al. | |
| 7,093,150 B1 | 8/2006 | Norman et al. | |
| 7,245,684 B2 | 7/2007 | Adkisson | |
| 7,288,973 B2 | 10/2007 | Zerbe et al. | |
| 7,409,612 B2 | 8/2008 | Van De Logt et al. | |
| 7,447,961 B2 | 11/2008 | Tan | |
| 7,509,549 B2 | 3/2009 | Larson et al. | |
| 7,613,967 B1 | 11/2009 | Tan | |
| 7,793,184 B2 * | 9/2010 | Douskey ............ | G01R 31/31721 714/25 |
| 7,831,856 B1 | 11/2010 | Liu et al. | |
| 7,975,197 B2 * | 7/2011 | Clark ............ | G01R 31/318552 714/726 |
| 7,984,369 B2 | 7/2011 | Sul et al. | |
| 7,987,401 B2 * | 7/2011 | Pandey ............ | G01B 31/31859 714/727 |
| 8,112,654 B2 | 2/2012 | Bjerregaard | |
| 8,205,182 B1 | 6/2012 | Zlatanovici et al. | |
| 8,438,437 B2 | 5/2013 | Jain et al. | |
| 8,694,844 B2 | 4/2014 | Whetsel | |
| 8,887,117 B1 | 11/2014 | Chuang | |
| 9,103,879 B2 | 8/2015 | Douskey et al. | |
| 9,116,205 B2 | 8/2015 | Douskey et al. | |
| 9,437,328 B2 | 9/2016 | Yang | |
| 9,459,651 B2 | 10/2016 | Moheban et al. | |
| 9,529,044 B1 * | 12/2016 | Taneja ............ | G01B 31/31855 |
| 9,733,308 B2 | 8/2017 | Whetsel | |
| 10,281,524 B2 | 5/2019 | Chadalavda et al. | |
| 10,317,463 B2 | 6/2019 | Sonawane et al. | |
| 2002/0162063 A1 | 10/2002 | Whetsel | |
| 2002/0196886 A1 | 12/2002 | Adkisson | |
| 2002/0199124 A1 | 12/2002 | Adkisson | |
| 2003/0053489 A1 | 3/2003 | Zerbe et al. | |
| 2003/0229834 A1 | 12/2003 | Cooke | |
| 2004/0190665 A1 | 9/2004 | Uratani et al. | |
| 2004/0194109 A1 | 9/2004 | Boros et al. | |
| 2005/0024074 A1 | 2/2005 | Benjamin et al. | |
| 2005/0055617 A1 | 3/2005 | Wang et al. | |
| 2005/0102643 A1 | 5/2005 | Hou et al. | |
| 2005/0209805 A1 | 9/2005 | Chang et al. | |
| 2005/0234674 A1 | 10/2005 | Bundy et al. | |
| 2005/0242836 A1 | 11/2005 | Goetting et al. | |
| 2005/0262492 A1 | 11/2005 | Goetting et al. | |
| 2006/0022724 A1 | 2/2006 | Zerbe et al. | |
| 2006/0026473 A1 | 2/2006 | Patrick Tan | |
| 2006/0095818 A1 | 5/2006 | Bratt et al. | |
| 2006/0149987 A1 | 7/2006 | Klowden et al. | |
| 2007/0106923 A1 | 5/2007 | Aitken et al. | |
| 2007/0300001 A1 | 12/2007 | Dirscherl et al. | |
| 2008/0008015 A1 | 1/2008 | Darbinyan et al. | |
| 2008/0034334 A1 | 2/2008 | Laouamri et al. | |
| 2008/0046770 A1 | 2/2008 | Jong et al. | |
| 2008/0276116 A1 | 11/2008 | Bjerregaard | |
| 2009/0150709 A1 | 6/2009 | Arnold et al. | |
| 2009/0184735 A1 | 7/2009 | Wicki et al. | |
| 2010/0223519 A1 | 9/2010 | Swoboda | |
| 2010/0235698 A1 | 9/2010 | Diewald et al. | |
| 2011/0099442 A1 * | 4/2011 | Hales ............ | G01R 31/31853 714/729 |
| 2011/0185240 A1 * | 7/2011 | Jeddeloh ............ | G11O 5/02 714/719 |
| 2011/0221469 A1 * | 9/2011 | Schlagenhaft ... | G01B 31/31854 326/16 |
| 2012/0117436 A1 | 5/2012 | Portolan et al. | |
| 2012/0146535 A1 | 6/2012 | Lee et al. | |
| 2012/0159276 A1 | 6/2012 | Zandian et al. | |
| 2013/0159800 A1 | 6/2013 | Ravi et al. | |
| 2013/0194016 A1 * | 8/2013 | Wimer ............ | H03K 19/0016 327/199 |
| 2014/0089750 A1 | 3/2014 | Douskey et al. | |
| 2014/0157067 A1 | 6/2014 | Yang | |
| 2014/0247080 A1 | 9/2014 | Moheban et al. | |
| 2014/0292385 A1 * | 10/2014 | Bahl ............ | H03K 3/012 327/144 |
| 2014/0298125 A1 | 10/2014 | Devadze et al. | |
| 2015/0046763 A1 * | 2/2015 | Makar ............ | G01R 31/31855 714/727 |
| 2015/0178102 A1 | 6/2015 | Regner et al. | |
| 2015/0220470 A1 | 8/2015 | Chen et al. | |
| 2015/0229469 A1 | 8/2015 | Hainz | |
| 2016/0070619 A1 | 3/2016 | Moran et al. | |
| 2016/0274178 A1 * | 9/2016 | Goel ............ | G01R 31/3008 |
| 2017/0115338 A1 | 4/2017 | Chadalavda et al. | |
| 2017/0115345 A1 | 4/2017 | Sonawane et al. | |
| 2017/0115346 A1 | 4/2017 | Sonawane et al. | |
| 2017/0115351 A1 | 4/2017 | Datla Jagannadha et al. | |
| 2017/0115353 A1 | 4/2017 | Sonawane et al. | |
| 2017/0133070 A1 | 5/2017 | Ware et al. | |
| 2017/0195754 A1 | 7/2017 | Grambichler et al. | |
| 2017/0205465 A1 | 7/2017 | Sarangi et al. | |

(56) References Cited

U.S. PATENT DOCUMENTS

2017/0269145 A1    9/2017    Whetsel
2018/0122444 A1    5/2018    Ware et al.

\* cited by examiner

1200

1210
Accessing a an edge of the first test clock signal based upon an edge of a second test clock signal associated with a second test partition.

1220
Shifting an edge of the first test clock signal based upon an edge of a second test clock signal associated with a second test partition.

1230
Performing test operations in the first partition in accordance with the first clock signal.

Fig. 12

INDEPENDENT TEST PARTITION CLOCK COORDINATION ACROSS MULTIPLE TEST PARTITIONS

RELATED APPLICATIONS

This application claims priority to and the benefit of following applications:

U.S. Provisional Application Ser. No. 62/247,195, filed on Oct. 27, 2015, entitled "SCANS SYSTEMS AND METHODS"; and U.S. Provisional Application Ser. No. 62/285,429, filed on Oct. 27, 2015, entitled "SCANS SYSTEMS AND METHODS";

which are all hereby incorporated by reference in their entirety for all intents and purposes.

FIELD OF THE INVENTION

The present invention relates to the field of circuit testing. In one embodiment, granular dynamic test systems and methods are utilized to generate partition test clocks.

BACKGROUND

Numerous electronic technologies such as digital computers, video equipment, and telephone systems have facilitated increased productivity and reduced costs in processing information in most areas of business, science, and entertainment. Testing the components is typically an important activity in ensuring proper performance and accurate results. The testing of semiconductor devices often involves performing test operations in accordance with controls referred to as test patterns. Execution of the test patterns typically involves loading and unloading scan chains with test vectors. However, there are a number of factors that can impact testing and traditional testing approaches are often costly and inefficient.

A system on chip (SoC) design is typically composed of several blocks of circuitry, some of which may have similar designs that are used or replicated in different parts of the chips. The several blocks of circuitry are often configured or organized in test blocks or test partitions for purposes of testing the circuitry. Traditional approaches to generating a full set of conventional test patterns targeted at multiple test partitions and executing the test patterns at substantially similar or parallel times is computationally intensive and time consuming. These conventional attempts are often unable to meet limited cost budgets and constrained project schedules.

Transistor feature sizes continue to shrink and smaller transistors allow more circuits to be included in a given die area. Although these technological advances offer a number of advantages, they also create design-for-testability (DFT) challenges. New process technologies are often more sensitive to peak test power and power droop problems. In a complex system-on-chip (SoC), interdependence of the clocking architecture across blocks and overall peak power consumption limits are typically major bottlenecks which hinder or prevent conventional independent parallel testing at a higher clock frequency. In addition, traditional elevated level of power dissipation during testing typically leads to higher die temperature compared to normal functional operation. The higher die temperature can result in improper transistor functions, which in turn cause reliability issues (e.g., due to electro-migration, etc.).

SUMMARY

Granular dynamic test systems and methods facilitate efficient and effective timing of test operations. In one embodiment, a chip test system comprises: a first test partition operable to perform test operations based upon a first local test clock signal; a second test partition operable to perform test operations based upon a second local test clock signal; and a centralized controller configured to coordinate testing between the plurality of test partitions, wherein the coordination includes managing communication of test information between the plurality of test partitions and external pins. In one exemplary implementation, a trigger edge of the first local test clock signal is staggered with respect to a trigger edge of the second local test clock signal, wherein the stagger is coordinated to mitigate power consumption by test operations in the first test partition and test operations in the second test partition.

The first local test clock and the second local test clock can be utilized for test scan shift operations in the first test partition and second test partition respectively. The stagger can be based upon mitigating scan shift peak power consumption. The stagger can be based upon mitigating average power consumption. The stagger can create skewed load-unload operations between scan chains in the first test partition and scan chains in the second test partition. Test operations associated with different test modes are aligned non-sequentially between the first test partition and the second test partition. The second test partition can comprise a clock trimmer.

The second test partition can include: a positive edge counter, a negative edge counter, a stagger logic, a negative edge divider, a positive edge divider, a decoder, and a multiplexer. The positive edge counter counts positive clock edges. The negative edge counter counts negative clock edges. The stagger logic introduces a shift in a clock edge. The negative edge divider is configured to divide the clock signal based on a negative edge count. The positive edge divider is configured to divide the clock signal based on a positive edge count. The stagger logic is coupled to the positive edge counter, the negative edge counter, the negative edge divider and the positive edge divider. The decoder is configured to control the negative edge divider and positive edge divider. The decoder is coupled to the negative edge divider and positive edge divider. The multiplexer is configured to select between an output of the negative edge divider and an output of the positive edge divider. The multiplexer is coupled to the negative edge divider, the positive edge divider and the stagger logic.

In one embodiment, a method of chip testing comprises: accessing a first test clock signal associated with a first partition; shifting an edge of the first test clock signal based upon an edge of a second test clock signal associated with a second test partition; and performing test operations in the first partition in accordance with the first clock signal. In one exemplary implementation, the method further comprises performing test operations in the second partition in accordance with the second test signal. The shifting can be coordinated to mitigate power consumption by the test operations in the first partition and test operations in the second partition. The shifting can be coordinated so that the test chains of the first partition are not actively shifted at the same time as test chains of the second partition. The test operations of the first partition can be scheduled dependent on the test operation of the second partition. An automatic test pattern generation (ATPG) can remain unchanged by the shifting. Test data volume is unchanged by the shifting. A first test clock for the first partition can be derived from a free running clock independent of a second test clock for the second partition, and the second test clock for the second partition can be derived from the free running clock independent of the first clock for the first partition.

In one embodiment a chip test system comprises: a first test partition configured to execute a first test pattern; a second test partition configured to execute a second test pattern; and a centralized controller configured to coordinate testing between the plurality of test partitions, wherein the coordination includes managing communication of test information between the plurality of test partitions and external pins. The first test partition is operable to execute the first test pattern in accordance with a first local test clock signal and the second test partition is operable to execute the second test pattern in accordance with a second local test clock signal, and an adjustment is made in timing of trigger edges associated with the first local test clock with respect to timing of trigger edges associated with the second local test clock. The adjustment can be coordinated to mitigate power consumption by test operations in the first test partition and test operations in the second test partition. The adjustment can be based on the flop count and distance from the power source. The adjustment can be associated with sequential based shift clock staggering.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 12 is a flow chart of an exemplary test method 1000 in accordance with one embodiment.

DETAILED DESCRIPTION

Figure 1:
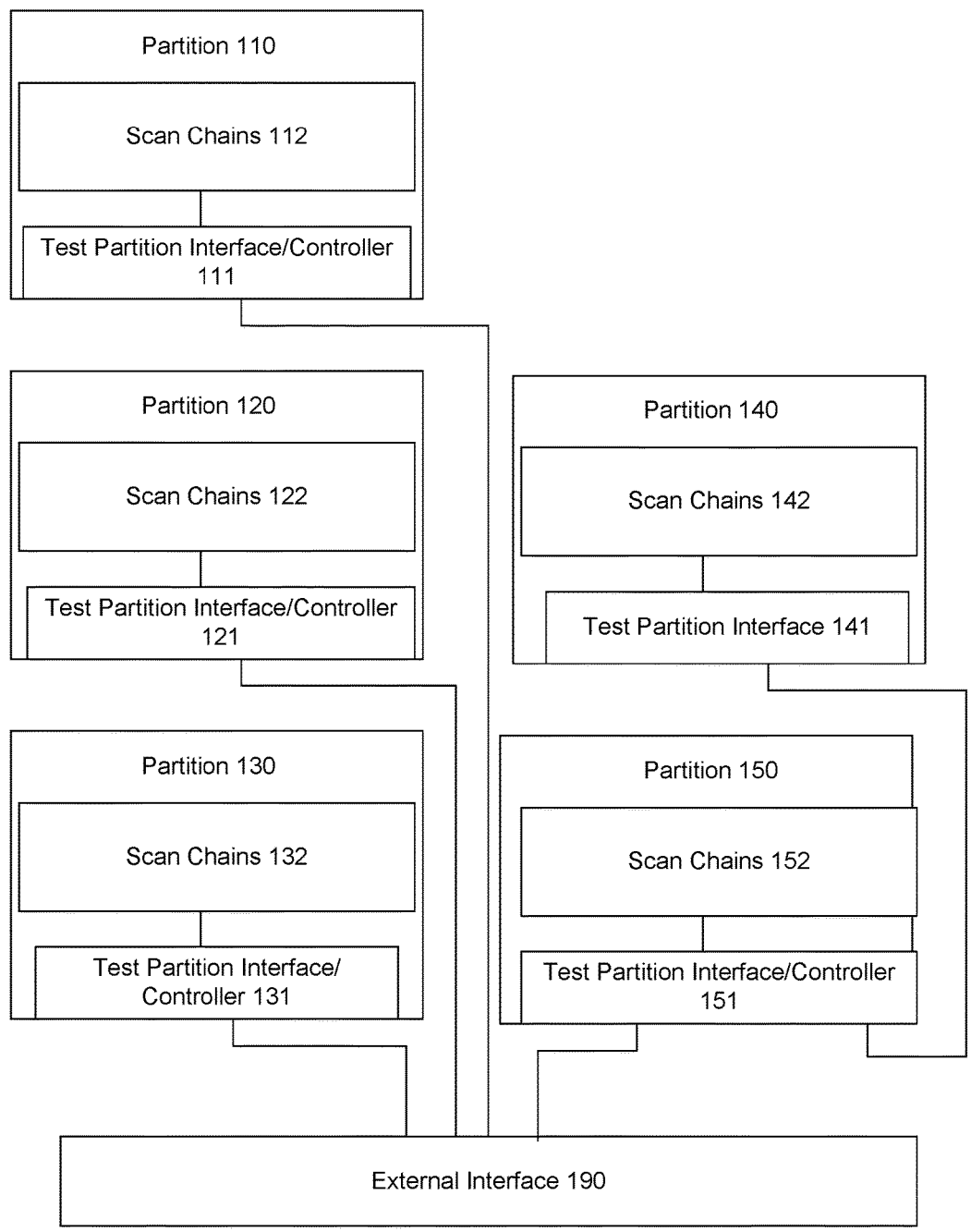
FIG. 1 is a block diagram of an exemplary test system in accordance with one embodiment.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Granular dynamic test systems and methods facilitate efficient and effective testing. In one embodiment, granular dynamic test systems and methods enable flexible staggering of test clock edges. The staggered test clocks enable peak power control. In one embodiment, peak power during testing is impacted by the number of flip-flops clocked at the same time on the active or trigger edge of the test clock. Staggering the test shift clock edges to reduce the toggle activity of flops on the same active clock edge can effectively reduce the peak power. In one embodiment, there is a focus on mitigating peak and average power by staggering shift clocks at a granular level (e.g., partition level, block level, etc,).

Partition Testing Approach

In one embodiment, circuits under test in a System On a Chip (SOC) design are configured or organized into a hierarchy of groups or sets of circuitry. A functional circuit and associated test circuitry are organized into test units or cells. The test units are coupled together into scan chains and the scan chains are configured or organized into test partitions or test blocks. The test partitions and components therein can be organized based on a variety of factors (e.g., components involved in a type of function, particular design of the circuitry, intellectual property, size, portion of die area, number of functional components, electrical characteristics, safety limitations, power consumption, etc.).

While the organization of test operations based upon test partitions does offer greater testing granularity, the increased number of test partitions and the many possible different test characteristics and features of the test partitions gives rise to very complex and complicated test environments. The presented granular dynamic testing systems and methods are configured to facilitate testing of the different complex characteristics and factors associated with the multiple test partitions in an efficient and effective manner.

FIG. 1 is a block diagram of test system 100 in accordance with one embodiment. Test system 100 includes test partition 110, test partition 120, test partition 130, test partition 140, test partition 150 and external interface 190. Test partitions 110, 120, 130,140, and 150 include scan chains 112, 122, 132, 142, and 152 respectively. Test partitions 110, 120, 130, and 140 include test partition interfaces/controllers 111, 121, 131, and 141. In one embodiment, test partitions 140 and 150 are very similar and are considered to be similar IP or functionally equivalent. As such, the test partition interface/controller 141 can be considered to provide control operations for test partition 150 via test partition interface 151. In one embodiment, test partition interface/controller 141 is considered a centralized controller for both test partition 140 and test partition 150. Test partition interface 151 can be less complex than test partition interface/controller 141 (e.g., interface 151 has less controls and is considered an interface rather than interface/controller). It is appreciated that test system 100 can have a variety of configurations. In one embodiment, there are some test interface and control operations that can be performed by a centralized controller even if the partitions are not similar (e.g., do not have same IP, are not functionally similar, etc.).

Figure 2:
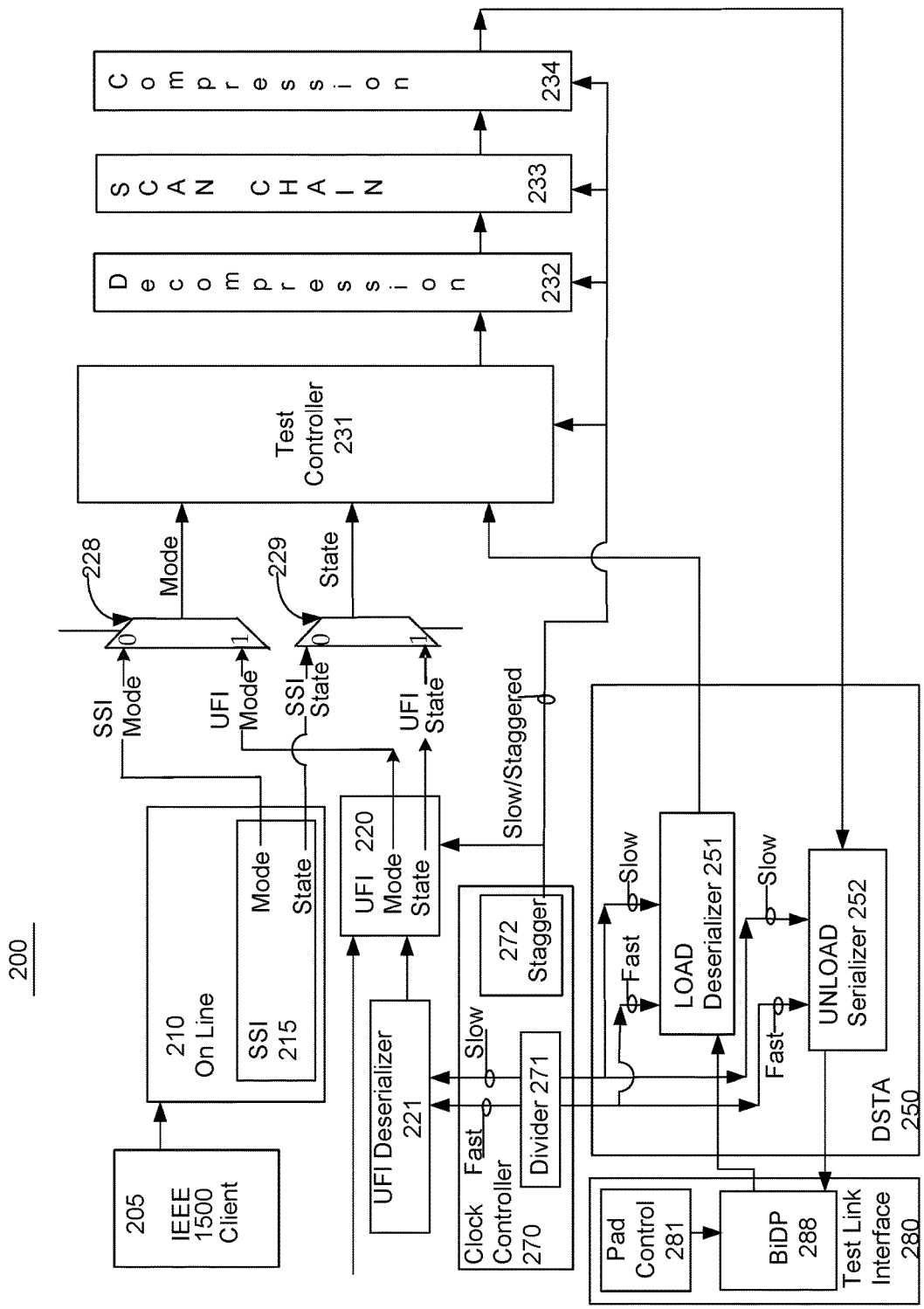
FIG. 2 is a block diagram of an exemplary system in accordance with one embodiment.

FIG. 2 is a block diagram of an exemplary system 200 in accordance with one embodiment. System 200 can operate as a test partition interface/controller. In one exemplary implementation, system 200 is similar to a test interface/controller 111 or 121. System 200 includes IEEE 1500 client interface 205, On Line module 210, Ultra Fast Interface (UFI) controller 220, UFI de-serializer 221, mode MUX 228, State MUX 229, Test Controller 231, Scan Decompression Component 232, Scan Chain Component 233, Scan Compression Component 234, Dynamic Scan Test Access (DSTA) Component 250, Clock Controller 270 and Test Link Interface 280 and Bi-Directional Pads 288. Mode MUX 228 and State MUX 229 are coupled to Test Controller 231, Ultra Fast Interface (UFI) controller 220 and On Line module 210 which is coupled to IEEE 1500 client interface 205. UFI 220 is coupled to UFI de-serializer 221. Clock controller 270 is coupled to Ultra Fast Interface (UFI) controller 220, UFI de-serializer 221, Test Controller 231, Scan Decompression Component 232, Scan Chain Component 233, Scan Compression Component 234, and DSTA 250. DSTA 250 is coupled to Bi-Directional Pads 288 which are in Test Link Interface 280. On Line module 210 can include SSI 215. Clock Controller 270 can include divider 271 and stagger 272. DSTA 250 can include load component 251 and unload component 252.

In one embodiment, UFI de-serializer 221 receives an ultra fast serial signal and de-serializes the signal into separate signals that are forwarded to the UFI module 220. UFI module 220 generates UFI mode information and UFI state information which is fed into mode MUX 228 and State MUX 229 respectively. On Line module 210 receives signals from IEEE 1500 client interface 205 and generates SSI mode information and SSI state information which is fed into mode MUX 228 and State MUX 229 respectively. Mode MUX 228 selects either the UFI mode information or SSI mode information and forwards the selected information to Test Controller 231. State MUX 229 selects either the UFI state information or SSI state information and forwards the selected information to Test Controller 231.

Test controller 231 organizes the test signals and forwards them to Scan Decompression Component 232. Scan Decompression Component 232 decompresses the signals and forwards them to Scan Chain Component 233. Scan Chain Component 233 performs the scan test operations (e.g., scan shift, scan capture, etc.) and forwards the results to Scan Compression Component 234. Scan Compression Component 234 compresses the test results and forwards the compressed test results to DSTA 250. DSTA 250 receives scan test input data from external connections of bi-directional pads 288 and forwards scan test output data to external connections of bi-directional pads 288. Test Link Interface 280 includes pad direction controller 281 that controls the communication direction of Bi-Directional Pads 288. Clock controller 270 generates clocks signals.

In one embodiment, the clock signals are coordinated in accordance with the rates of input and output signals of the various components. In one exemplary implementation, Clock controller 270 receives a single free flowing clock input and generates a fast internal clock, a slow internal clock and a slow staggered internal clock. The fast internal clock and slow internal clock are forwarded to the UFI deserializer 221, LOAD deserializer 251, and UNLOAD serializer 252 for use in respective deserializing/serializing operations. The slow staggered internal clock is forwarded to Test Controller 231, Scan Decompression Component 232, Scan Chain Component 233 and Scan Compression Component 234 for clocking the test operations of the respective components.

Staggering Partition Test Clocks During Shift Operations

Figure 3:
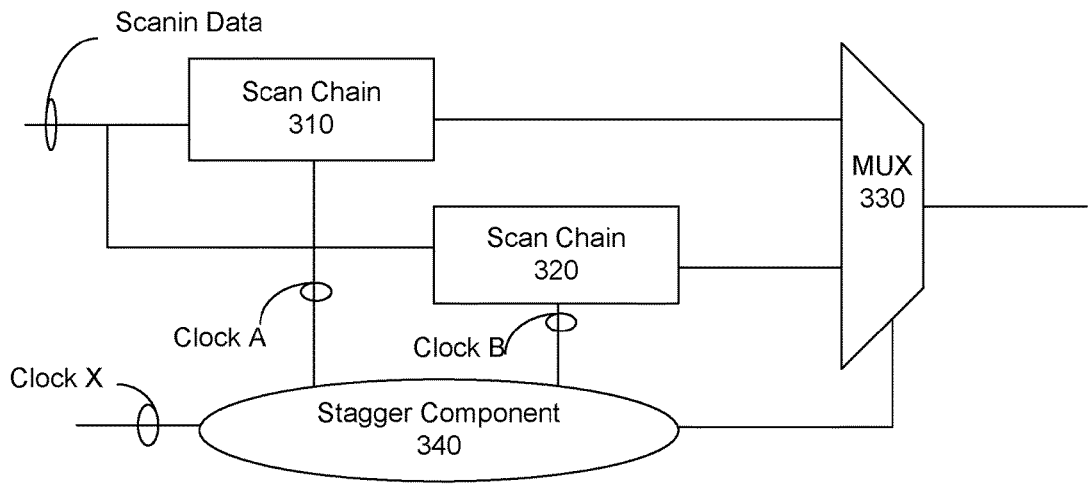
FIG. 3 is a block diagram of an exemplary test clock stagger system in accordance with one embodiment.

FIG. 3 is a block diagram of an exemplary test clock stagger system 300 in accordance with one embodiment. A clock signal X is received by stagger component 340. Stagger component 340 generates clock A signal and clock B signal which are used as test clocks by scan chain 310 and scan chain 320. The active edges of clock A signal and clock B signal are staggered and do not occur simultaneously. The stagger can be set in accordance with power consumption of the respective scan chains 310 and 320. In one exemplary implementation, the stagger is set to mitigate or reduce peak power consumption. The stagger can be set to accommodate characteristics of a component in which the staggered clocks are used (e.g., heat dissipation characteristics of a die, reaction characteristics of transistors, etc.). The outputs of scan chain 310 and scan chain 320 are forwarded to MUX 330. In one embodiment, the MUX is controlled by a signal from stagger component 340 (which can be considered a clock signal generator and output control component).

Figure 4:
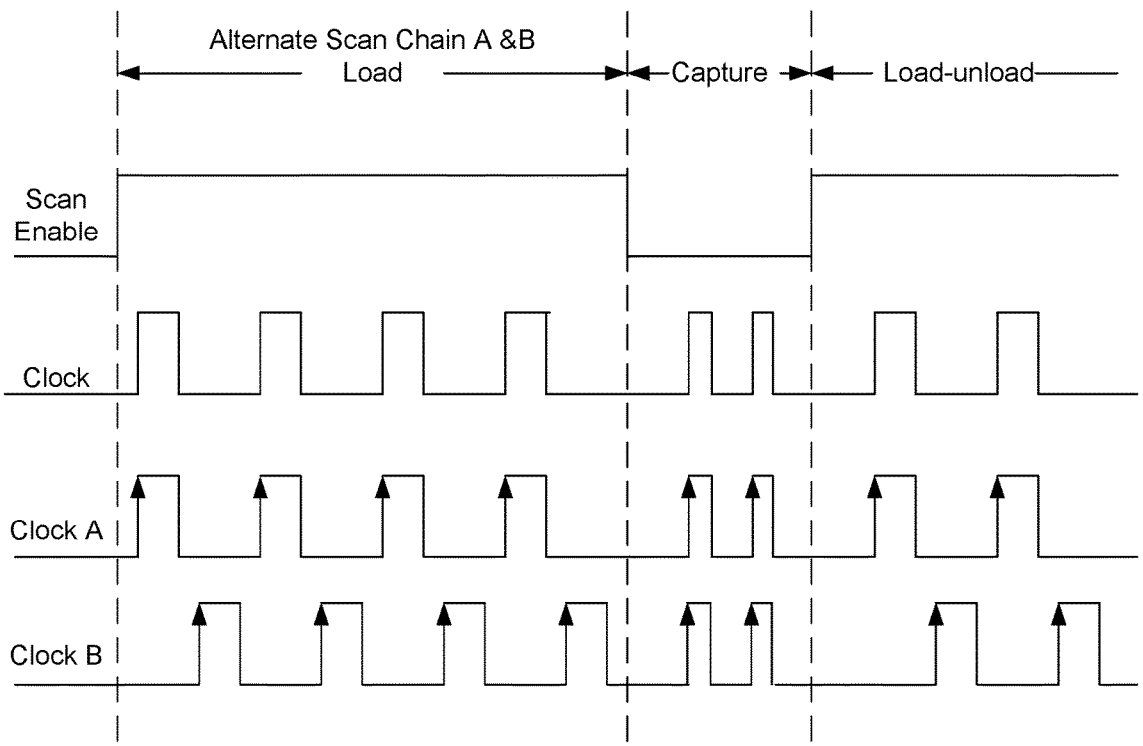
FIG. 4 is an exemplary timing diagram of test clock signals for system in accordance with one embodiment.

FIG. 4 is an exemplary timing diagram of test clock signals for system 300 in accordance with one embodiment. As illustrated in FIG. 4, the active or trigger edges of clock A and clock B are staggered so that shift load activities for scan chain A and scan chain B do not occur simultaneously. In one embodiment, the active or trigger edges are staggered so that operations are alternated during shift mode. When scan chain A is active loading test information scan chain B is not active loading, and when scan chain B is active loading test information scan chain A is not active loading. The active or trigger edges of clock A and clock B can be substantially concurrent during capture mode operations. The active or trigger edges of clock A and clock B can be staggered again during shift unload mode operations. Within a single scan chain (e.g., within scan chain A, within scan chain B, etc.) load and unload activities may occur substantially concurrently. The loading and unloading may occur while another scan chain is substantially not active. In one exemplary implementation, while scan chain B is not actively shifting test output data is being unloaded in scan chain A and different test input data is being loaded in scan chain A.

It is appreciated that the stagger test clock stagger approach is readily adaptable to a variety of environments. The test clock stagger system and method is compatible with receipt of multiple different clock signals or receipt of a single clock signal that is divided into multiple different clock signals. In one embodiment, a granular dynamic test system and method includes a test clock stagger feature. A granular dynamic test system and method clock stagger approach can use a sequential based shift clock staggering method that allows wider staggering delays based on SSD fast clock edges. In one exemplary implementation, the granularity of the staggering is one-half cycle of the SSD fast clock and the maximum number of stagger edges is twice the SSD ratio. For a SSD ratio of 4:1 at 250 MHz, 8 edges can be used (e.g., 0 ns, 2 ns, 4 ns, . . . , 12 ns, 14 ns, etc.). Timing closure is significantly easier once the clock domain crossings are properly understood in test mode. In one embodiment, a granular dynamic test system and method clock stagger approach takes advantage of a scan serializer/deserializer (SSD) architecture, where multiple scan chains are driven from very few external scan I/O chip pins.

Figure 5:
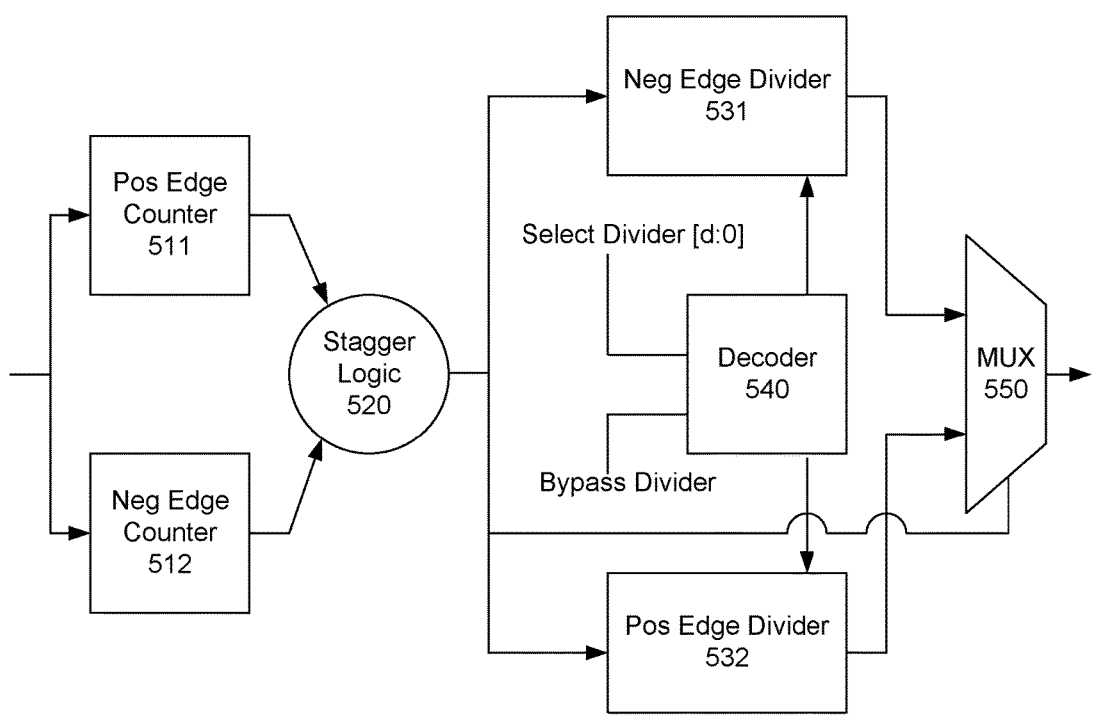
FIG. 5 is a block diagram of exemplary test clock stagger system in accordance with one embodiment.

FIG. 5 is a block diagram of exemplary test clock stagger system 500 in accordance with one embodiment. In one embodiment, test clock stagger system 500 is a SSD clock controller which generates a staggered SSD Clock depending on the input configuration. Test clock stagger system 500 includes positive edge counter 511, negative edge counter 512, stagger logic 520, negative edge divider 531, positive edge divider 532, decoder 540 and multiplexer 550. Positive edge counter 511 and negative edge counter 512 are coupled to stagger logic 520 which in turn is coupled to negative edge divider 531, positive edge divider 532 and MUX 550. Negative edge divider 531 and positive edge divider 532 are coupled to decoder 540 and MUX 550.

Positive edge counter 511 counts positive clock edges. Negative edge counter 512 counts negative clock edges. Stagger logic 520 introduces a shift in a clock edge fed into the negative edge divider 531 and the positive edge divider 532. Negative edge divider 531 is configured to divide the clock signal based on a negative edge count. Positive edge divider 532 is configured to divide the clock signal based on a positive edge count. Decoder 540 is configured to control the negative edge divider 531 and positive edge divider 532. MUX 550 is configured to select between an output of the negative edge divider 531 and an output of the positive edge divider 532. In one exemplary implementation, scan chains receive a staggered version of a shift clock signal from the output of MUX 550.

Figure 6A:
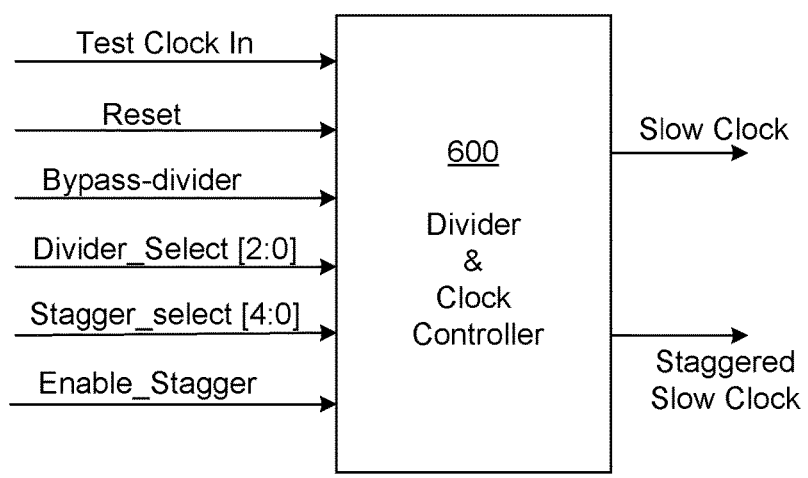
FIG. 6A is a block diagram of partition test clock controller in accordance with one embodiment.

FIG. 6A is a block diagram of partition test clock controller 600 in accordance with one embodiment. In one exemplary implementation, the test clock controller 600 generates both a slow clock signal and a staggered slow clock signal using an input test clock. Partition test clock controller 600 receives a test clock in signal, a reset signal, a bypass-divider signal, a divider select signal, a stagger select signal and enable stagger signal. Test clock controller 600 outputs a slow clock signal and a staggered slow clock signal. In one embodiment, a test clock in signal is routed to a test partition and a staggered slow clock is derived locally at the test partition using test clock controller 600.

Figure 6B:
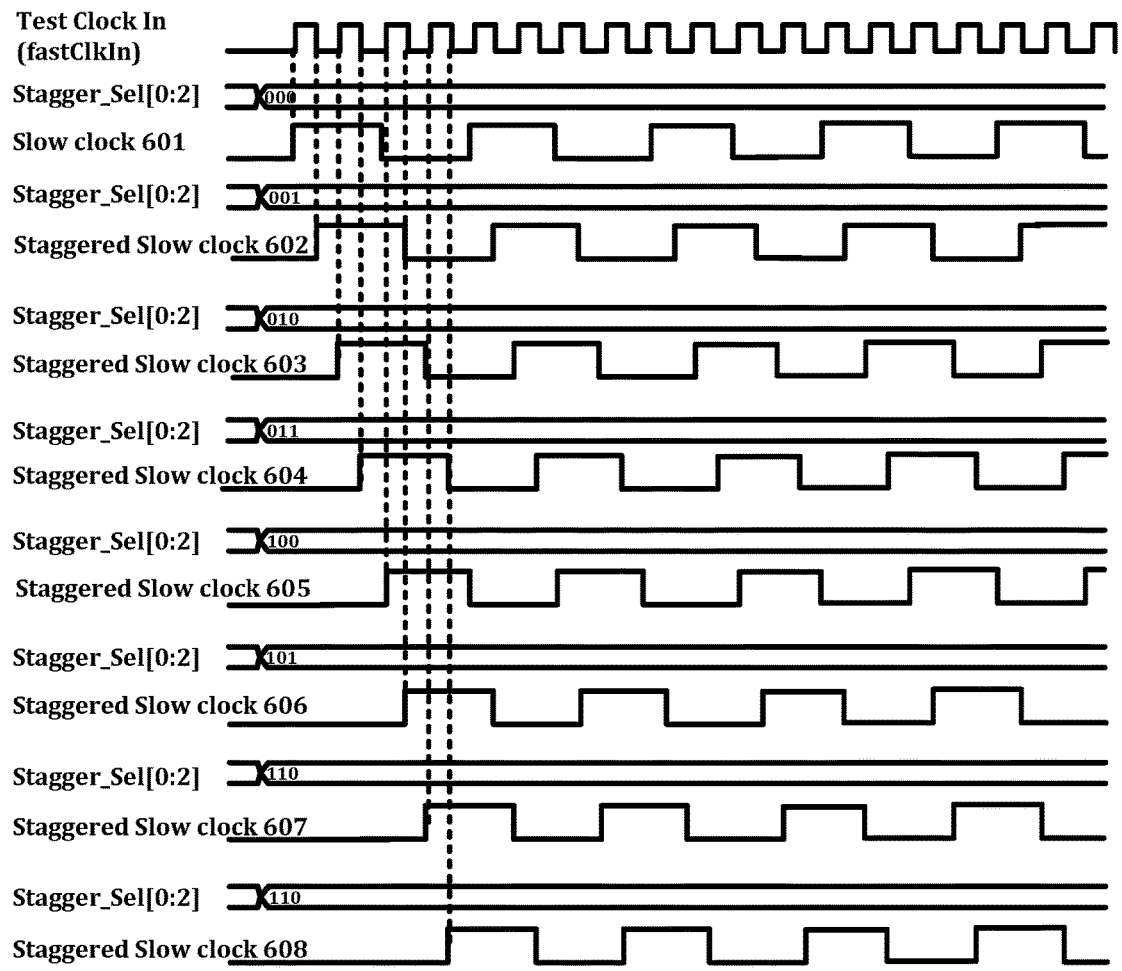
FIG. 6B is an exemplary timing diagram for partition test clock controller in accordance with one embodiment.

FIG. 6B is an exemplary timing diagram for partition test clock controller 600 in accordance with one embodiment. The test clock in signal can be controlled from a pin associated with external ATE. The test clock in signal can be considered a fast clock in signal. The output slow clock signal is a divided down version of the input test clock in signal. The supported divide ratios are 4, 6, 8, and 12. The following timing examples are explained based on a divide ratio 4. The output slow clock signal can be controlled using 3 Jtag bits in the select_divider[2:0] signal. For divide-by-4, the maximum of 8 combinations of staggered slow clocks can be achieved (4 positive edges and 4 negative edges) and eight exemplary possible edges are shown. In general the illustrated scheme can produce 2N possible staggering combinations, where N is the divide ratio. In one exemplary implementation, when the bypass_divider signal is programmed, the slow clock out signal will be similar to the test clock in signal.

The staggered slow clock signal 601 is a divided down version of the test clock in signal plus staggering. In one embodiment, the staggered slow clock signal 602 is a delayed version of the slow clock signal and the amount of delay is in periods of the test clock in signal. Staggered slow clock is controlled using the stagger_select[3:0] signal which can be programmed using the 3 Jtag bits. Also the Jtag bits and enable_stagger signal can be used to disable staggering. In one exemplary implementation, this means that the default value of the enable_stagger signal is 0 to disable staggering. These bits are programmed during the ATPG init programming. When the stagger_select signal is programmed to '000' and the enable_stagger signal is programmed to 1, the staggered slow clock starts from the first negative edge of the test clock in signal. In the example illustrated in FIG. 6B, slow clock signal 601 and stagger slow clock signals 602, 603, 604, 605, 606, 607, and 608 are generated. In one exemplary implementation, staggering is achieved by ensuring that the clocks to different scan flip flops in a partition have different duty cycles or different phases, thereby, reducing the number of simultaneous transitions. In one embodiment, the duty cycle of the clock does not change with staggering, which in turn can facilitate no change in the timing sign off of various stagger modes.

In traditional scan based tests, a significant portion of test time is spent loading and unloading test patterns or test vectors in the scan chains for application of test vectors. In scan based designs, test patterns are loaded into the scan chain by serial shifting. Traditional scan shift operations typically consume 50% to 75% of the total test time for a chip. During the shifting, the combinational logic driven by the scan elements are also excited. The switching activity during a scan based test can be several times higher than during functional modes of operation of the circuit. This results in increased test power consumption that in turn can result in chip reliability issues. High test power consumption is generally addressed in terms of average power and peak power. The average power is the ratio of total energy consumed and test time. Peak power is the maximum instantaneous power consumed by the circuit during any clock cycle.

Regulating peak power is important for a number reasons. Excess peak power consumption can result in IR drop or VDD droop, which in turn can result in noise issues and incorrect circuit behavior due to an inadequate power supply environment. The testing IR drop can cause an otherwise functionally good chip to fail during test (e.g., due to false failures, etc.) resulting in yield loss. Excessive peak power can exceed a chip's or package's heat dissipation limits. This is relevant from a reliability standpoint since hot-spots generated by a rise in temperature due to elevated power consumption can affect circuit operation. Excessive heat dissipation can damage the chip during testing and may cause reliability issues that lead to failures in the field after shipment. Traditionally, peak power is important in determining the number of tester power supplies for a device, and hence can restrict the number of devices that can be tested in parallel.

Figure 7:
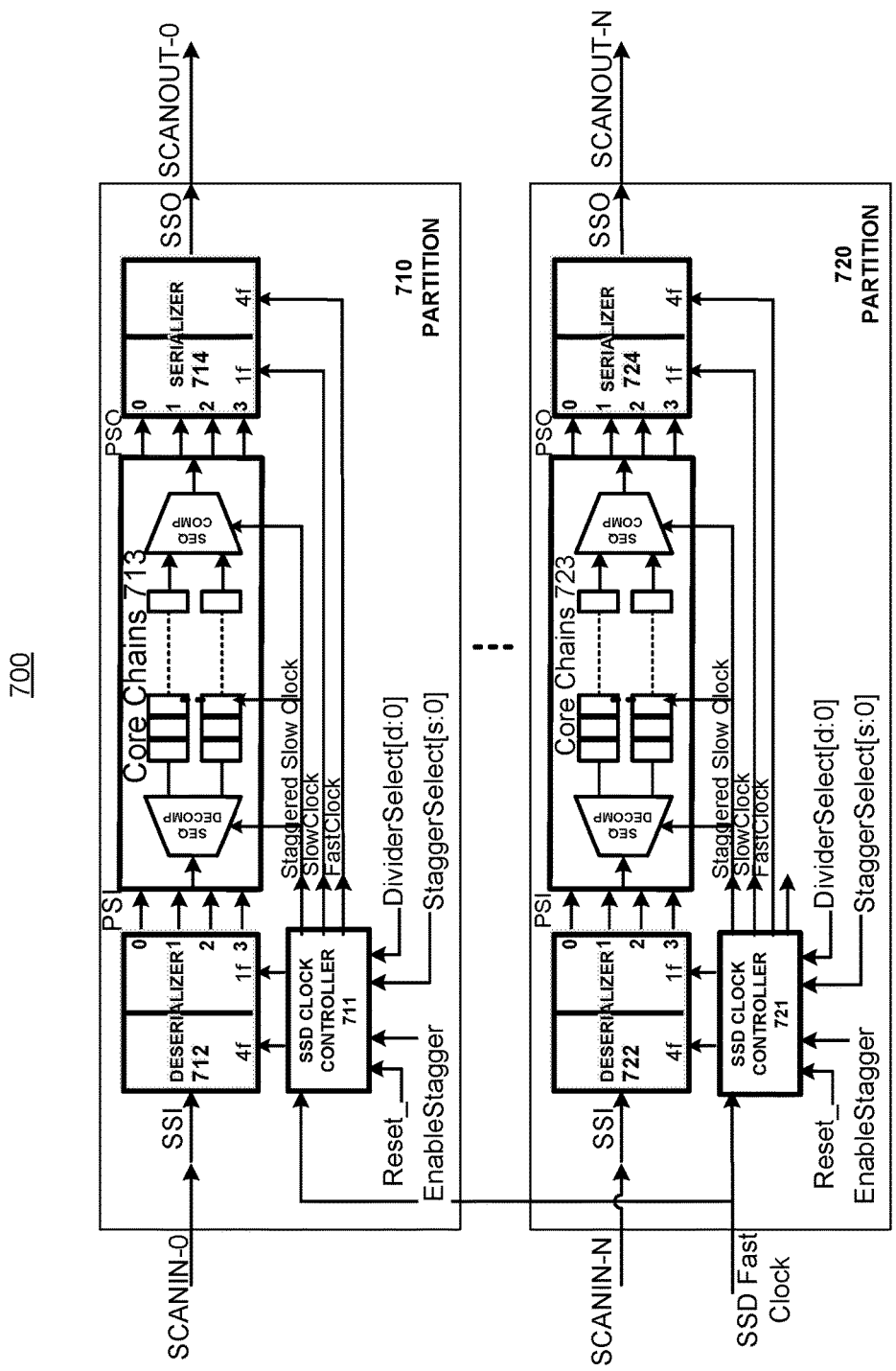
FIG. 7 is a block diagram of granular dynamic test clock system in accordance with one embodiment.

FIG. 7 is a block diagram of granular dynamic test clock system 700 in accordance with one embodiment. In one embodiment, granular dynamic test clock system 700 includes the application of staggered test clocks to multiple partitions in accordance with one embodiment. A test partition (e.g., 710, 720, etc.) includes a partition test clock controller (e.g., 711, 721, etc.), deserializer (e.g., 712, 722, etc.), core chains (e.g., 713, 723, etc.) and serializer (e.g., 714, 724, etc.). The partition test clock controllers output the stagger clock for the core chains and the slow and fast clocks for the serializer and deserializer. In one embodiment, the solution uses clock staggering during scan shift and allows one partition's scan chains to toggle at a time, while scan chains from neighboring partitions remain silent.

Figure 8:
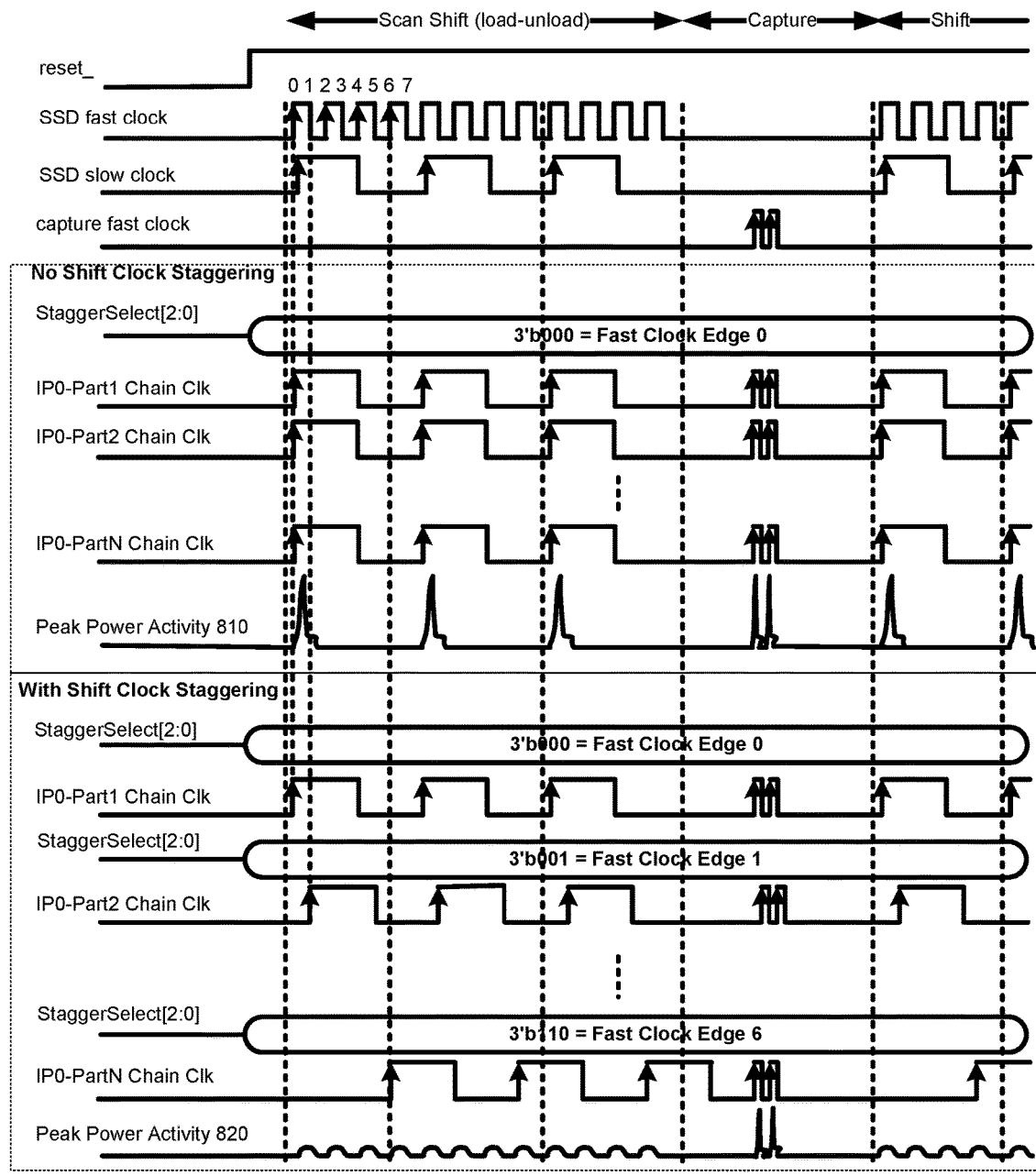
FIG. 8 is a timing diagram of clock signals with and without stagger in accordance with one embodiment.

FIG. 8 is a timing diagram of clock signals with and without stagger in accordance with one embodiment. The diagram illustrates the high average shift power consumption 810 without stagger due to excessive peak power incidents per shift clock cycle. The timing causes excessive power consumption during shift operations (which can increase failure rates) and can also cause IR-drop (which can slow down the device speed). The diagram also illustrates clock signals with stagger using an example of 4:1 SSD ratio and the resulting lower average shift power consumption 810 due to fewer peak power incidents per shift clock cycle. In one embodiment, there are a total of 8 stagger clock edges to choose from for shifting core chains of each partition in accordance with one embodiment. Consequently, power rail structures around those partitions can be utilized without causing significant IR drop during shift.

Stagger test clocks can enable shifting of scan chains at higher frequencies which in turn can reduce test time without causing false failures. In one embodiment, for neighboring partitions that share the same power rail, the goal is to program different stagger settings for the respective SSD clock controllers so that they do not actively shift the core chains at the same time. Capture power problems are solved using different methods which and not discussed so as to not obfuscate the invention.

Design Updates and Timing Signoff

Figure 9:
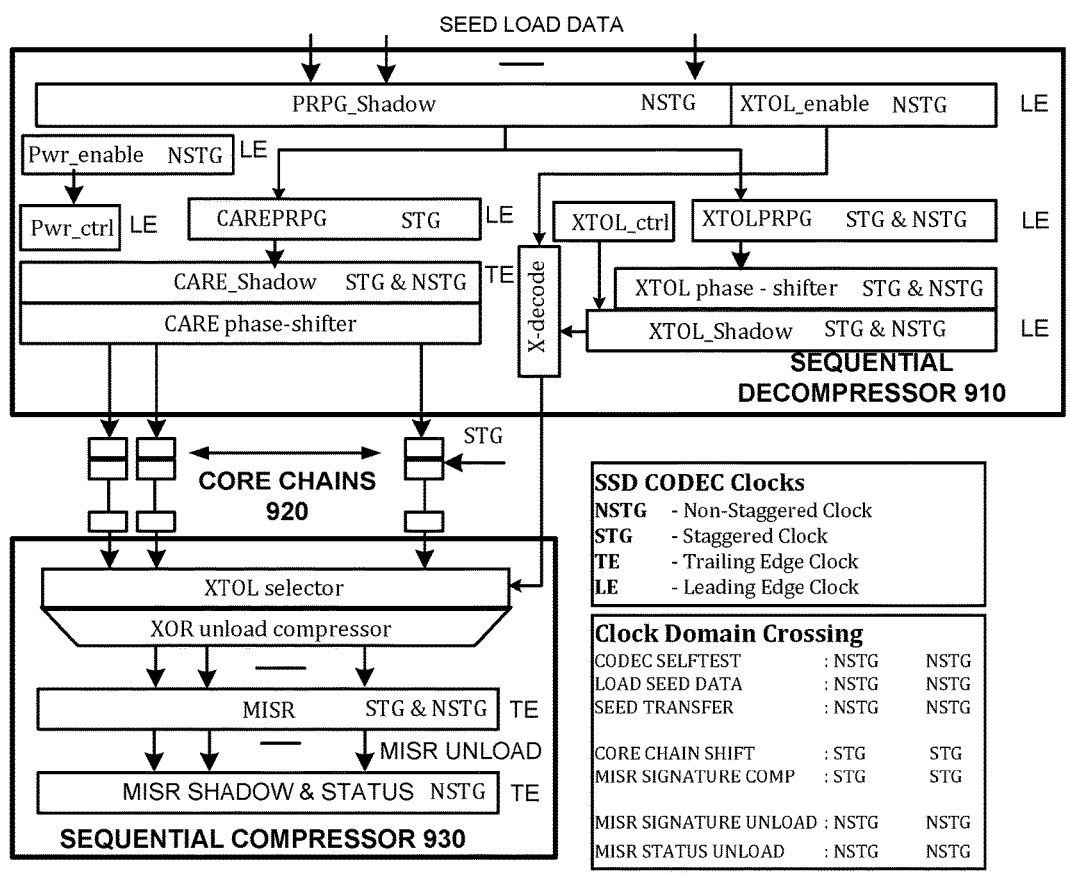
FIG. 9 shows the high level architecture schematic for exemplary test system 900 in accordance with one embodiment.

The scan shift clock stagger technique can be used with or without scan compression. In one embodiment, the emphasis is to use shift clock staggering with sequential scan compression logic. In one exemplary implementation, the sequential scan compression technique uses high overall compression of test data and test time, and a simplified and consistent interface across partitions to promote reuse of design blocks. FIG. 9 shows the high level architecture schematic for exemplary test system 900 in accordance with one embodiment. Test system 900 is similar to conventional test systems except it includes logic to adjust the clock gate enable controls of various components (e.g., careprg, xtol-prpg, misr, xtol_ennable, etc.) so that the system works seamlessly with scan chains on a stagger clock. Test system 900 includes sequential decompressor 910, scan chains 920, and sequential compressor 930. Partition level PRPG and MISR based Compressor/Decompressors (CODECs) provide compression and contain logic for efficiently dealing with unknown values (Xs) of various densities. Scan input data to internal scan chains is supplied from CARE PRPG and scan output data is captured in a MISR. The X-tolerance (XTOL) control block and a separate XTOL PRPG prevent unknown values from reaching the MISR while also optimizing scan cell observability.

New seed data is loaded as often as needed and the internal chain shift can be stopped if necessary to reseed PRPGs from the tester. The common PRPG shadow can load the next CARE or XTOL seed while the PRPGs, the internal chains and the MISR continue operating with the previously loaded seeds, allowing reseed cycles to overlap with internal shift cycles. The internal scan chains of each of the partitions can be loaded and unloaded (described above) independently with respect to other partitions. The internal core chains of each partition can use specific shift clock stagger settings to reduce peak shift power. A Single SSD clock can be used to drive the various components of sequential compression logic and internal core chains.

In one embodiment, the clock domain crossing (e.g., Staggered (STG) clock and Non-staggered (NSTG) clock, etc.) is signed off during place and route optimization. For timing optimization, an NSTG clock and STG clocks with multiple ratios can be defined in prime-time. During production testing, it is expected that any of the STG clock edges may be used and timing on each of the stagger clocks is closed. To handle the use of the STG clocks sequential scan compression logic can be updated to include only multi-cycle functional paths between NSTG to STG clock domains and vice versa. In one exemplary implementation, the single cycle paths are in the intra-STG or intra-NSTG clock domains.

Figure 10:
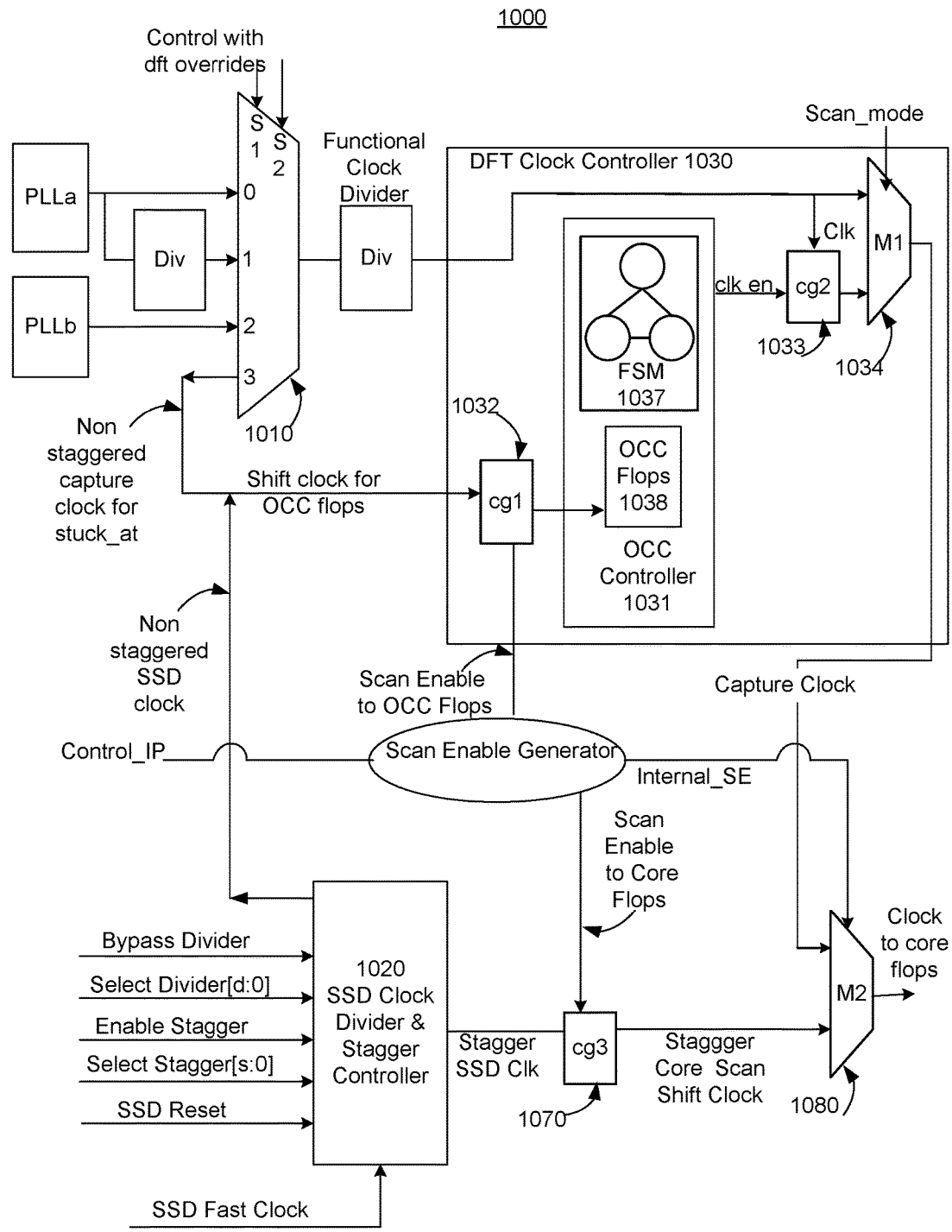
FIG. 10 is a block diagram of an exemplary abstracted clocking architecture schematic in accordance with one embodiment.

FIG. 10 is a block diagram of an exemplary abstracted clocking architecture schematic in accordance with one embodiment. The 4:1 clock MUX selects either a functional clock (e.g., PLLa, a division of PLLa, PLLb, etc.) or a Non Staggered SSD clock. The SSD Clock Divider & Stagger Controller (SSD clock controller) 1020 provides a Staggered SSD Clock for core shift operation and a Non Staggered SSD Clock for On-Chip-Clock (OCC) chain shift and stuck-at capture operation for core chains. DFT clock controller 1030 includes the OCC controller 1038 and supporting logic (e.g., clock gaters—cg1, cg2 and mux M1) to provide the capture clock for ATPG patterns. The scan enable generator block generates the localized scan enable for OCC flops (SE to OCC flops) and scan enable for Core flops (SE to Core flops). These scan enable signals gate the SSD clock outputs out of the SSD clock controller to generate the required number of shift pulses for OCC flops and Core flops. The other modes of MBIST and IOBIST can use the functional PLL clocks, which passes through leg 0 of the mux M1.

Based on the values loaded into the OCC flops, the Finite State Machine (FSM) inside the OCC controller generates the clk_en signal to gate the capture clock source (using clock gater cg2) and generate the required number of capture pulses for ATPG patterns. The resultant Capture_clk then drives the leg 0 of mux M2. The Shift_clk is sourced from the output of clock gater cg3 (Staggered Core Chain Shift Clock) and drives leg 1 of the mux M2. The signal Internal_SE controls the switching between the shift and capture clocks accordingly. For the MBIST and IOBIST patterns, the signal Internal_SE is 0 and allows the functional PLL clock to flow through.

Figure 11:
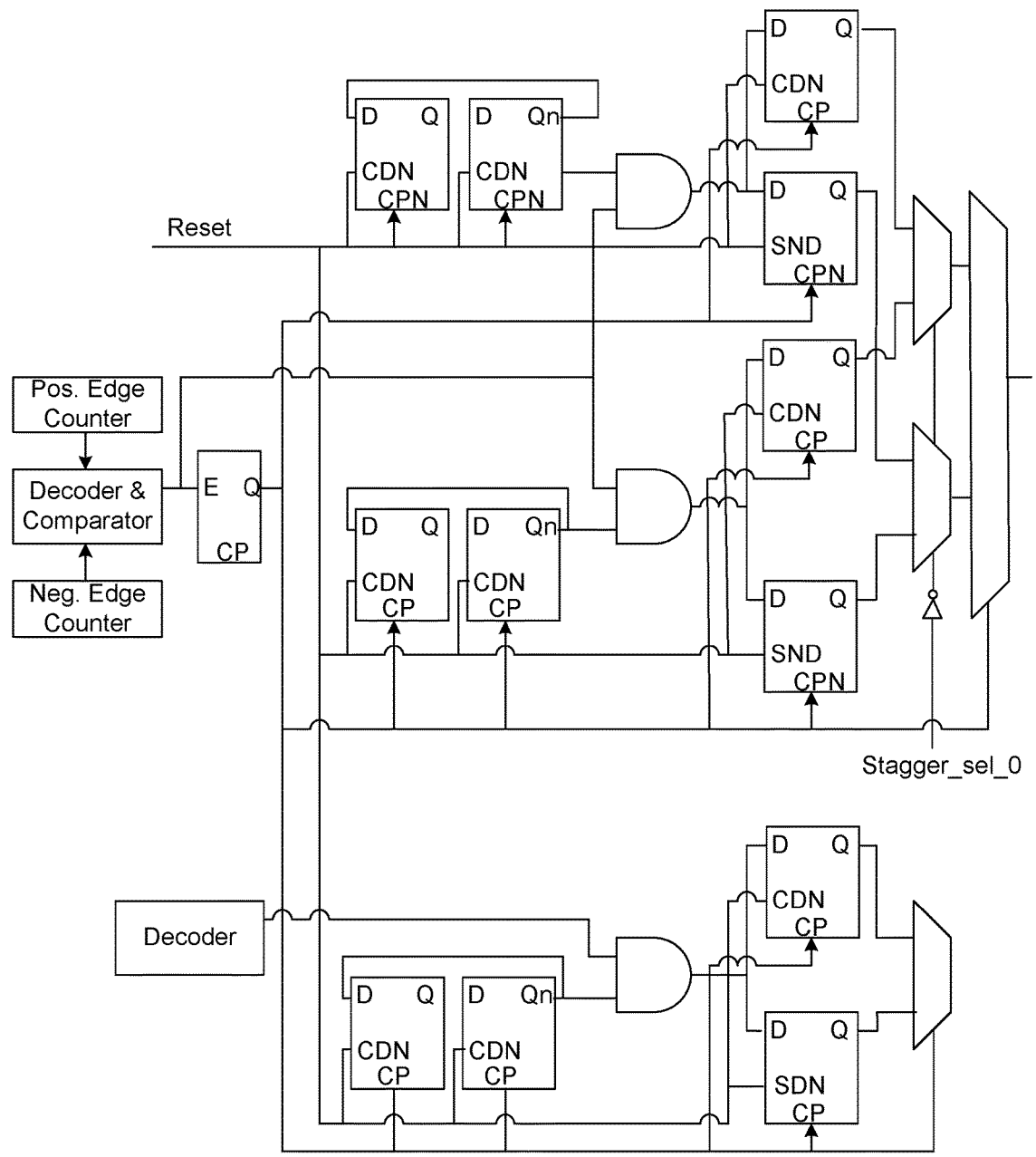
FIG. 11 is a block diagram of exemplary internal components of a clock controller divider logic in accordance with one embodiment.

In one embodiment, a granular dynamic test system and method staggered clock is generated with minimal logic on the clock path. FIG. 11 is a block diagram of exemplary internal components of a clock controller divider logic in accordance with one embodiment. The clock controller divider logic controls the test partition level module of clock division and shift staggering. The internal details are of divide-by-4 logic.

In FIG. 11, the SlowClock is generated by first decoding the input Jtag bits followed by the divider logic, this portion of logic is highlighted in dotted lines. In case of staggered Slow Clock, first the input Jtag bits decoded and at the same time two counters are used to count the number of positive and negative edges of the TestClockIn. Since the proposed approach staggers both the negative as well as positive edges there are separate counters. If the programmed Jtag value of Stagger_select[3:0] matches the counter output, the clock gate is opened. This sends the clock to the downstream divider logic which produces the staggered slow clock. Here the invalid values that are disabled through the decoder module. For example, the two invalid scenarios in the illustrated divide-by-4 occur if Stagger_Select[3:0]>=8.

FIG. 12 is a flow chart of an exemplary test method 1200 in accordance with one embodiment.

In block 1210, a first test clock signal associated with a first partition is accessed. In one embodiment, a first test clock for the first partition is derived from the free running clock independent of a second test clock for the second partition, and the second test clock for the second partition is derived from the free running clock independent of the first clock for the first partition.

In block 1220, an edge of the first test clock signal is shifted based upon an edge of a second test clock signal associated with a second test partition. The shifting is coordinated to mitigate power consumption by the test operations in the first partition and test operations in the second partition. The shifting is coordinated so that the test chains of the first partition are not actively shifted at the same time as test chains of the second partition. The test operations of the first partition are scheduled dependent on the test operation of the second partition.

In block 1230, test operations are performed in the first partition in accordance with the first clock signal. Test operations can also be performed in the second partition in accordance the second test signal. An automatic test pattern generation (ATPG) and test data volume are unchanged by the shifting.

In one embodiment, a local peak power reduction level of granularity is based upon test partitions. An appropriate stagger select JTAG bit can be programmed for a test partition based on the flip flop count within a partition and distance of the partition from a power source. A granular dynamic test system and method can be insensitive to the timing corners. In one exemplary implementation, the JTAG based settings identified for a test partition is applicable to all the timing corners. The test clock staggering can be independent of the on-chip compression used in the chip and highly effective in reducing peak shift power. The granular dynamic test system and method test clock staggering can have little or no impact on physical design aspects such as clocking and power supply. In one embodiment, there is no change required to the ATPG flow and the solution does not prevent or make the applicability of tests harder. In turn, the risk of adverse impacts to timely and effective deployment of the test clock staggering is low. In on embodiment, granular dynamic test system and method test clock staggering has a good profile when the following dimensions are considered in evaluating the test power reduction technique. The systems and methods enable power reduction effectiveness and usability with/without compression, negligible die area size is utilized, there is little or no adverse consequence for several types of potential impacts (e.g., ATPG Coverage impact, ATPG Flow impact, test data volume impact, test time impact, physical design impact, functional timing impact, deployment risk impact, etc.). Conventional approach typically can not cover these dimensions.

It is appreciated that granular dynamic test systems and methods can be coordinated with other test system operations. In one embodiment, Scan Serializer/Deserializer (SSD) is a time-division demultiplexing/multiplexing based scan architecture. It uses a small number of pins that interface with ATE and shift serial scan data at higher speeds. Load blocks or deserializers, are used before sending this data to Pseudo Scan Inputs (PSIs) at a lower frequency. Similarly Pseudo Scan Outputs (PSOs) send the scan data to unload blocks or serializers, before it reaches top level pins. In one exemplary implementation of an N:1 SSD ratio, an SSD fast clock runs at N times the speed of internal shift frequency.

With reference back to FIG. 2, in one embodiment, operations within a component of system 200 can be coordinated with various other components and features of system 200, external interfaces and components within a test partition. In one embodiment, a UFI and test clock generation is coordinated with DSTA serialization and deserialization operations.

Additional information regarding an Ultra Fast Interface (UFI) is set forth in related co-pending application Ser. No. 15/336,716, entitled Granular Dynamic Test Systems and Methods filed on Oct. 27, 2016, which is incorporated herein by reference.

Additional information regarding DSTA is set forth in related co-pending application Ser. No. 15/336,736, entitled Dynamic Scan Test Access (DSTA) filed on Oct. 27, 2016, which is incorporated herein by reference.

Additional information regarding coordination of external pad configuration is set forth in related co-pending application Ser. No. 15/336,687, entitled Test Partition External Input/Output Interface Control filed on Oct. 27, 2016, which is incorporated herein by reference.

Additional information regarding on-line test operations and JTAG test operations is set forth in related co-pending application Ser. No. 15/336,747, entitled Scan System Interface (SSI) filed on Oct. 27, 2016, which is incorporated herein by reference.

Additional information regarding free running clock and independent test partition clock coordination is set forth in related co-pending application Ser. No. 15/336,626, entitled Dynamic Independent Test Partition Clocks filed on Oct. 27, 2016, which is incorporated herein by reference.

The granular dynamic test systems and methods can be used in a variety of applications (e.g., CPUs, GPUs, mobile device SoCs, etc.). The granular dynamic test systems and methods can be used for both production testing and on-line testing. The production testing can be directed to finding manufacturing defects and the on-line testing can be directed to finding errors that develop after product shipment. The granular dynamic testing systems and methods support testing features for external testing (e.g., testing with Automatic Test Equipment (ATE)) as well as on system internal testing.

A granular dynamic test system and method can allow parallel testing of multiple test partitions in a given SoC. It also enables greater multi-site testing opportunities to further lower the test cost. The granular dynamic test systems and methods can include a dynamic test clock architecture that eliminates or reduces the interdependency in clocking across blocks and allows substantially concurrent yet independent testing of a block with its own pattern set. The granular dynamic test system and method architecture contributes to significant reduction of test application time by improving the scan shift frequency and efficiently utilizing the ATE resources by optimally scheduling various tests.

Several conventional low-power techniques have been proposed to attempt power reduction during testing in order to lower the power droop and reduce overheating of the silicon die. The conventional low-power solutions for block level DFT typically fall into two categories. The first category of conventional low-power solutions is mainly based on power and test time constrained test scheduling techniques. However, these traditional test methods typically group the inter-dependent blocks and test them at a lower frequency to fit within a given power budget, thereby increasing the test time. The second category of low-power solutions are typically related to structure of scan design and generation of test patterns. These include scan chain reordering, X-filling to minimize transitions, scan chain partitioning and staggering scan shift clock using global skew based delays. Each method has its own drawbacks.

Conventional scan segmentation approaches typically try to attack the problem of concurrent scan shift by either ensuring that scan shift is done only for limited portions of scan chains at any given time (scan segmentation) or by performing scan test (shift and/or capture) in a modular manner. Such a low-power DFT technique usually requires clock gating and bypass multiplexers for scan segment access. Traditional scan segmentation approaches also typically require changes to the ATPG flow. Furthermore, scan segment control implementation is usually needed and there are often routing implications. Some conventional approaches require changing the scan chain order in a specific way. However, this is usually not feasible (e.g., because of routing limitations, timing limitations, etc.) and can adversely impact project schedules. Attempts to shift segments of scan chains at a given time typically increases the test application time. Other methods of X-filling to minimize transitions typically increases test data volume and are not easily applicable to scan compression schemes.

Conventional gated scan cell attempts often use blocking circuitry. Combinational circuit toggling that happens during scan shift can be eliminated if the blocking circuitry can be incorporated at all Q outputs of the scan flip flops. The Q output is held constant (at 0) during scan shift, eliminating switching activity in the combinational logic connected to Q. However, there are a number of significant challenges that have hindered implementation of conventional gated scan cell attempts, including design overheads (area and functional timing), scan enable related timing closure, and an inability of commercial synthesis flows to understand gated scan cells.

There are some conventional staggered clocking schemes that involve staggering the clock during shift to attempt power savings without significantly affecting test application time. These approaches typically send the staggered test clocks with different duty cycles or different phases from the chip external edge to the scan flip flops (or chains). However, there are usually a number of adverse deployment risks associated with conventional staggered clocking schemes and the level of granularity achieved by these traditional staggering schemes is typically limited. Another disadvantage with these techniques is if there is a divider downstream of the staggered clock, then the duty cycle is reduced.

One conventional approach to ensure the clocks to different scan flip flops have different duty cycles or different phases involve adding trimmers on the test clock path. However, there are a number of significant challenges that have hindered implementation of conventional trimmer based clock stagger attempts. Trimmers are sensitive to PVT issues (e.g., a trimmer setting identified for one corner will not typically be applicable to another corner, etc.). Conventional clock trimmer based skew efforts at separating the clock shift activity by finite amounts of time is often inefficient in terms of timing closure. Trimmer approaches typically require significant resources to implement (increasing the costs) and additional engineering resources are required to characterize the ATE patterns (which usually delays the time-to-market the chip). One traditional attempt to stagger shift clocks uses clock trimmers on the shift clock branch of each partition. The amount of clock staggering that can be achieved by a trigger mechanism is typically limited to a few hundred picoseconds (ps) and the time delay is usually not sufficient for neighboring partitions to recover from the effects of voltage droop. Furthermore, a conventional clock trimmer delay mechanism usually needs timing closure for possible delay values to be used during production test. Achieving the timing closure can be a challenging task, especially in the case of sequential scan compression which can place additional timing constraints on design.

Granular dynamic test clock systems and methods overcome a number of the adverse issues associated with conventional approaches. The profitability of integrated circuits manufacturing depends heavily on the fabrication yield. When a good chip is falsely considered as a faulty, it leads to manufacturing yield loss. Using the clock controller based peak power reduction, the yield loss due to test power manageable control. For example, for data from a particular test clock frequency some transition fault patterns passed only after the supply voltage is beyond a particular voltage value. Failures at voltages lower than the particular voltage were identified to be caused by increased switching in the shift time window (high peak power), leading to a significant IR drop resulting in a lower Vdd available at the subsystem being tested. Lower voltages applied at the chip periphery can cause the timing of the subsystem to be quite different and cause the transition fault patterns to fail, although there is no inherent timing defect.

In one embodiment, granular dynamic test system and method test clock stagger can facilitate reduced test times which can facilitate reduced testing costs. Partition level shift clock staggering can reduce the peak power during scan shift, which scan shift to be run at higher clock speeds, which in turn can reduce the overall test time during production test. Test power consumption can have a direct implication on device reliability, system design, and various aspects of the physical design cycle such as packaging and power grid design. In one embodiment, granular dynamic test system and method stagger does not require special power grid design for test power. Parallel testing of multiple test partition can reduce the overall test application time and therefore, enhance the test throughput. Granular dynamic test system and method test clock staggering can facilitate avoidance of damage to the chip associated with excessive energy dissipation and development of thermal hot spots.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

The invention claimed is:

1. A chip test system comprising:
    a first test partition operable to perform test operations based upon a first local test clock signal;
    a second test partition operable to perform test operations based upon a second local test clock signal, wherein a trigger edge of the first local test clock signal is staggered with respect to a trigger edge of the second local test clock signal, wherein the stagger is coordinated to mitigate power consumption by test operations in the first test partition and test operations in the second test partition, wherein the stagger is also based on respective distance from a power source to the first test partition and second test partition and respective flop counts in the first test partition and second test partition; and
    a centralized controller configured to coordinate testing between the plurality of test partitions, wherein the coordination includes managing communication of test information between the plurality of test partitions and external pins.

2. The chip test system of claim 1, wherein the first local test clock and the second local test clock are utilized for test scan shift operations in the respective first test partition and second test partition.

3. The chip test system of claim 1, wherein the stagger is based upon mitigating scan shift peak power consumption.

4. The chip test system of claim 1, wherein the stagger is based upon mitigating average power consumption.

5. The chip test system of claim 1, wherein the stagger creates skewed load-unload between scan chains in the first test partition and scan chains in the second test partition.

6. The chip test system of claim 1, wherein test operations associated with different test modes are aligned non-sequentially between the first test partition and the second test partition.

7. The chip test system of claim 1, wherein the second test partition comprises:
    a positive edge counter that counts positive clock edges;
    a negative edge counter that counts negative clock edges;
    stagger logic that introduces a shift in a clock edge, the stagger logic coupled to the positive edge counter and the negative edge counter;
    a negative edge divider configured to divide the clock signal based on a negative edge count, the negative edge divider coupled to the stagger logic;
    a positive edge divider configured to divide the clock signal based on a positive edge count, the positive edge divider coupled to the stagger logic;
    a decoder configured to control the negative edge divider and positive edge divider, the decoder coupled to the negative edge divider and positive edge divider; and
    a multiplexer configured to select between an output of the negative edge divider and an output of the positive edge divider, the multiplexer coupled to the negative edge divider, the positive edge divider and the stagger logic.

8. The chip test system of claim 1, wherein the second test partition comprises a clock trimmer.

9. A method of chip testing, the method comprising:
    accessing a first test clock signal associated with a first partition;
    shifting an edge of the first test clock signal based upon an edge of a second test clock signal associated with a second test partition, wherein the shift is based on respective distance from a power source to the first test partition and second test partition and respective flop counts in the first test partition and second test partition; and
    performing test operations in the first partition in accordance with the first clock signal.

10. The method of claim 9, further comprising performing test operations in the second partition in accordance with the second test signal.

11. The method of claim 10, wherein the shifting is coordinated to mitigate power consumption by the test operations in the first partition and test operations in the second partition.

12. The method of claim 9, wherein the shifting is coordinated so that the test chains of the first partition are not actively shifted at the same time as test chains of the second partition.

13. The method of claim 9, wherein the test operations of the first partition are scheduled dependent on the test operation of the second partition.

14. The method of claim 9, wherein an automatic test pattern generation (ATPG) is unchanged by the shifting.

15. The method of claim 9, wherein test data volume is unchanged by the shifting.

16. The method of claim 9, wherein a first test clock for the first partition is derived from the free running clock independent of a second test clock for the second partition, and the second test clock for the second partition is derived from the free running clock independent of the first clock for the first partition.

17. A chip test system comprising:
    a first test partition configured to execute a first test pattern;
    a second test partition configured to execute a second test pattern, wherein the first test partition is operable to execute the first test pattern in accordance with a first local test clock signal and the second test partition is operable to execute the second test pattern in accordance with a second local test clock signal, and an adjustment is made in timing of trigger edges associated with the first local test clock with respect to timing of trigger edges associated with the second local test clock, wherein the second test partition comprises:
        a positive edge counter that counts positive clock edges;
        a negative edge counter that counts negative clock edges;

stagger logic that introduces the adjustment in a clock edge, the stagger logic coupled to the positive edge counter and the negative edge counter;

a negative edge divider configured to divide the clock signal based on a negative edge count, the negative edge divider coupled to the stagger logic;

a positive edge divider configured to divide the clock signal based on a positive edge count, the positive edge divider coupled to the stagger logic;

a decoder configured to control the negative edge divider and positive edge divider, the decoder coupled to the negative edge divider and positive edge divider; and a multiplexer configured to select between an output of the negative edge divider and an output of the positive edge divider, the multiplexer coupled to the negative edge divider, the positive edge divider and the stagger logic; and a centralized controller configured to coordinate testing between the plurality of test partitions, wherein the coordination includes managing communication of test information between the plurality of test partitions and external pins.

18. The chip test system of claim 17, wherein the adjustment is coordinated to mitigate power consumption by test operations in the first test partition and test operations in the second test partition.

19. The chip test system of claim 17, wherein the adjustment is based on the flop count and distance from the power source.

20. The chip test system of claim 17, wherein the adjustment is associated with sequential based shift clock staggering.

\* \* \* \* \*